United States Patent
Yonekura (10) Patent No.: US 12,525,943 B2
(45) Date of Patent: Jan. 13, 2026

(54) FILTER DEVICE

(71) Applicant: Murata Manufacturing Co., Ltd., Nagaokakyo (JP)

(72) Inventor: Tomohiro Yonekura, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 133 days.

(21) Appl. No.: 18/416,979

(22) Filed: Jan. 19, 2024

(65) Prior Publication Data

US 2024/0162876 A1 May 16, 2024

Related U.S. Application Data

(63) Continuation of application No. PCT/JP2022/024676, filed on Jun. 21, 2022.

(30) Foreign Application Priority Data

Aug. 4, 2021 (JP) .................. 2021-128048

(51) Int. Cl.
*H03H 7/01* (2006.01)
*H03H 1/00* (2006.01)

(52) U.S. Cl.
CPC ........ *H03H 7/0115* (2013.01); *H03H 7/1766* (2013.01); *H03H 2001/0085* (2013.01)

(58) Field of Classification Search
CPC ............... H03H 7/0115; H03H 7/1766; H03H 2001/0085; H03H 7/46; H03H 7/0123; H03H 7/1758; H01F 17/00; H01F 27/00; H01G 4/40
USPC ................................................. 333/175, 185
See application file for complete search history.

(56) References Cited

U.S. PATENT DOCUMENTS

| | | |
|---|---|---|
| 2009/0295501 A1 | 12/2009 | Hayashi et al. |
| 2020/0403597 A1 | 12/2020 | Takeuchi |
| 2021/0028753 A1 | 1/2021 | Tanaka |
| 2023/0275552 A1* | 8/2023 | Mori .................... H03H 7/1741 333/185 |

FOREIGN PATENT DOCUMENTS

| | | |
|---|---|---|
| JP | 2005210607 A | 8/2005 |
| JP | 2021002810 A | 1/2021 |
| JP | 2021019304 A | 2/2021 |
| WO | 2008004557 A1 | 1/2008 |

OTHER PUBLICATIONS

International Search Report in PCT/JP2022/024676, mailed Sep. 27, 2022, 3 pages.
Written Opinion in PCT/JP2022/024676, mailed Sep. 27, 2022, 4 pages.

* cited by examiner

*Primary Examiner* — Jorge L Salazar, Jr.
(74) *Attorney, Agent, or Firm* — Keating & Bennett, LLP (57) ABSTRACT

A filter device includes a dielectric substrate, a common terminal, first and second terminals, and first and second filters. The first filter includes first and second capacitors connected in series. The first capacitor includes first and second flat electrodes facing each other. The second capacitor includes the second flat electrode and a third flat electrode facing each other. In a plan view looking from a normal direction of the dielectric substrate, the first flat electrode and the third flat electrode overlap with each other at least partially.

20 Claims, 7 Drawing Sheets

FILTER DEVICE

CROSS REFERENCE TO RELATED APPLICATIONS

This application claims the benefit of priority to Japanese Patent Application No. 2021-128048 filed on Aug. 4, 2021 and is a Continuation application of PCT Application No. PCT/JP2022/024676 filed on Jun. 21, 2022. The entire contents of each application are hereby incorporated herein by reference.

BACKGROUND OF THE INVENTION

1. Field of the Invention

The present disclosure relates to filter devices each including multiple filters with different pass bands, and more particularly, to techniques for improving characteristics of the filter devices.

2. Description of the Related Art

Japanese Unexamined Patent Application Publication No. 2021-19304 discloses a configuration of a diplexer including a high pass circuit and a low pass circuit. The diplexer disclosed in Japanese Unexamined Patent Application Publication No. 2021-19304 includes, as input and output terminals for connection to an external device, a common terminal, a first terminal, and a second terminal.

The high pass circuit is disposed between the common terminal and the first terminal, and the low pass circuit is disposed between the common terminal and the second terminal. Furthermore, in the diplexer disclosed in Japanese Unexamined Patent Application Publication No. 2021-19304, two capacitors are connected in series between the common terminal and the first terminal in the high pass circuit. Those two capacitors include one common flat electrode.

SUMMARY OF THE INVENTION

However, if a connection distance between the two capacitors connected in series between the common terminal and the first terminal is long, a parasitic inductance generated in a connection portion between them increases, and this may cause reduction in characteristics of the diplexer.

Example embodiments of the present invention are provided to, in filter devices each including multiple filters, reduce parasitic inductance generated in a connection portion between two capacitors that are connected in series between a common terminal and a first terminal, and to improve the characteristics of each of the filter devices.

A filter device according to a certain aspect of an example embodiment of the present disclosure includes a dielectric substrate, a common terminal, a first terminal, a second terminal, a first filter, and a second filter. The common terminal, the first terminal, and the second terminal are located in or on the dielectric substrate. The first filter is connected between the common terminal and the first terminal. The second filter is connected between the common terminal and the second terminal and has a lower pass band than the first filter. The first filter includes a first capacitor and a second capacitor that are connected in series between the common terminal and the first terminal. The first capacitor includes a first flat electrode and a second flat electrode facing each other. The second capacitor includes the second flat electrode and a third flat electrode facing each other. In a plan view looking from a normal direction of the dielectric substrate, the first flat electrode and the third flat electrode overlap with each other at least partially.

The first capacitor included in a filter device according to an example embodiment of the present disclosure includes the first flat electrode and the second flat electrode, and the second capacitor includes the second flat electrode and the third flat electrode. In other words, the first capacitor and the second capacitor include the second flat electrode in common, and in the plan view looking from the normal direction of the dielectric substrate, the first flat electrode and the third flat electrode overlap with each other at least partially. With such a configuration, since a connection distance between the first capacitor and the second capacitor is short, a parasitic inductance generated in a connection portion between the first capacitor and the second capacitor, both connected in series between the common terminal and the first terminal, can be reduced, and characteristics of the filter device can be improved.

The above and other elements, features, steps, characteristics and advantages of the present invention will become more apparent from the following detailed description of the example embodiments with reference to the attached drawings.

DETAILED DESCRIPTION OF THE EXAMPLE EMBODIMENTS

Example embodiments of the present disclosure will be described in detail below with reference to the drawings. It is to be noted that the same or corresponding components in the drawings are denoted by the same reference signs and description of those components is not repeated.

Equivalent Circuit of Filter Device 1

Figure 1:
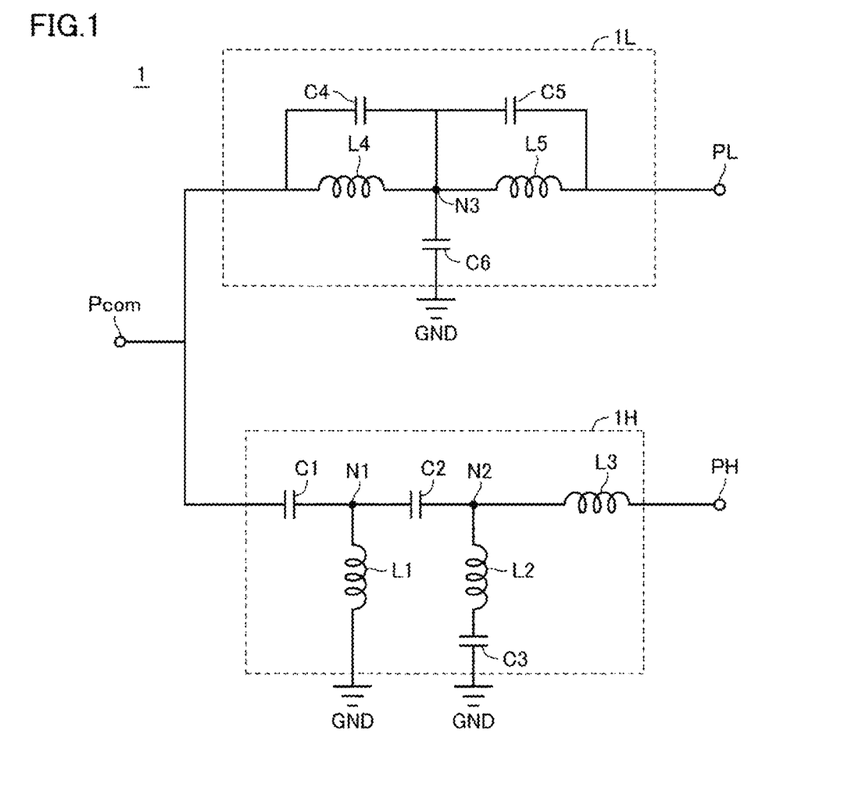
FIG. 1 is an equivalent circuit diagram of a filter device according to an example embodiment of the present invention.

FIG. 1 is an equivalent circuit diagram of a filter device 1 according to this example embodiment. The filter device 1 is a diplexer including a filter 1H and a filter 1L. The filter 1H passes a radio frequency signal in a high band HB therethrough. The filter 1L passes a radio frequency signal in a low band LB therethrough. The low band LB is a lower pass band than the high band HB. Thus, the filter 1L is a filter with a lower pass band than the filter 1H. The filter 1H corresponds to a "first filter" in the present disclosure, and the filter 1L corresponds to a "second filter" in the present disclosure.

The filter device 1 can be applied to, for example, a so-called dual-band communication device capable of performing communication in two frequency bands, namely the high band HB and the low band LB. Note that the filter device 1 may be a multiplexer including three or more filters, for example.

The filter device 1 further includes a common terminal Pcom, a first terminal PH, a second terminal PL, and ground terminals GND in addition to the filter 1H and the filter 1L. The common terminal Pcom is connected to each of the filter 1H and the filter 1L.

The filter 1H is connected between the common terminal Pcom and the first terminal PH. The filter 1H includes a capacitor C1, a capacitor C2, a capacitor C3, an inductor L1, an inductor L2, and an inductor L3.

The capacitor C1, the capacitor C2, and the inductor L3 are connected in series between the common terminal Pcom and the first terminal PH in the order mentioned. Thus, the capacitor C1 and the capacitor C2 are connected in series. The capacitor C1 corresponds to a "first capacitor" in the present disclosure, and the capacitor C2 corresponds to a "second capacitor" in the present disclosure.

One end portion of the capacitor C1 is connected to the common terminal Pcom, and the other end portion thereof is connected to one end portion of the capacitor C2. The other end portion of the capacitor C2 is connected to one end portion of the inductor L3. The other end portion of the inductor L3 is connected to the first terminal PH.

The inductor L1 is connected between a node N1 between the capacitor C1 and the capacitor C2 and the ground terminal GND. The inductor L2 and the capacitor C3 are connected between a node N2 between the capacitor C2 and the inductor L3 and the ground terminal GND. One end portion of the inductor L2 is connected to the node N2, and the other end portion thereof is connected to one end portion of the capacitor C3. The other end portion of the capacitor C3 is connected to the ground terminal GND.

The filter 1L is connected between the common terminal Pcom and the second terminal PL. The filter 1L includes a capacitor C4, a capacitor C5, a capacitor C6, an inductor L4, and an inductor L5.

The inductor L4 and the inductor L5 are connected in series between the common terminal Pcom and the second terminal PL. One end portion of the inductor L4 is connected to the common terminal Pcom, and the other end portion thereof is connected to one end portion of the inductor L5. The other end portion of the inductor L5 is connected to the second terminal PL.

The capacitor C4 is connected in parallel to the inductor L4. The capacitor C5 is connected in parallel to the inductor L5. The capacitor C6 is connected between a node N3 between the inductor L4 and the inductor L5 and the ground terminal GND.

Structure of Filter Device 1

Figure 2:
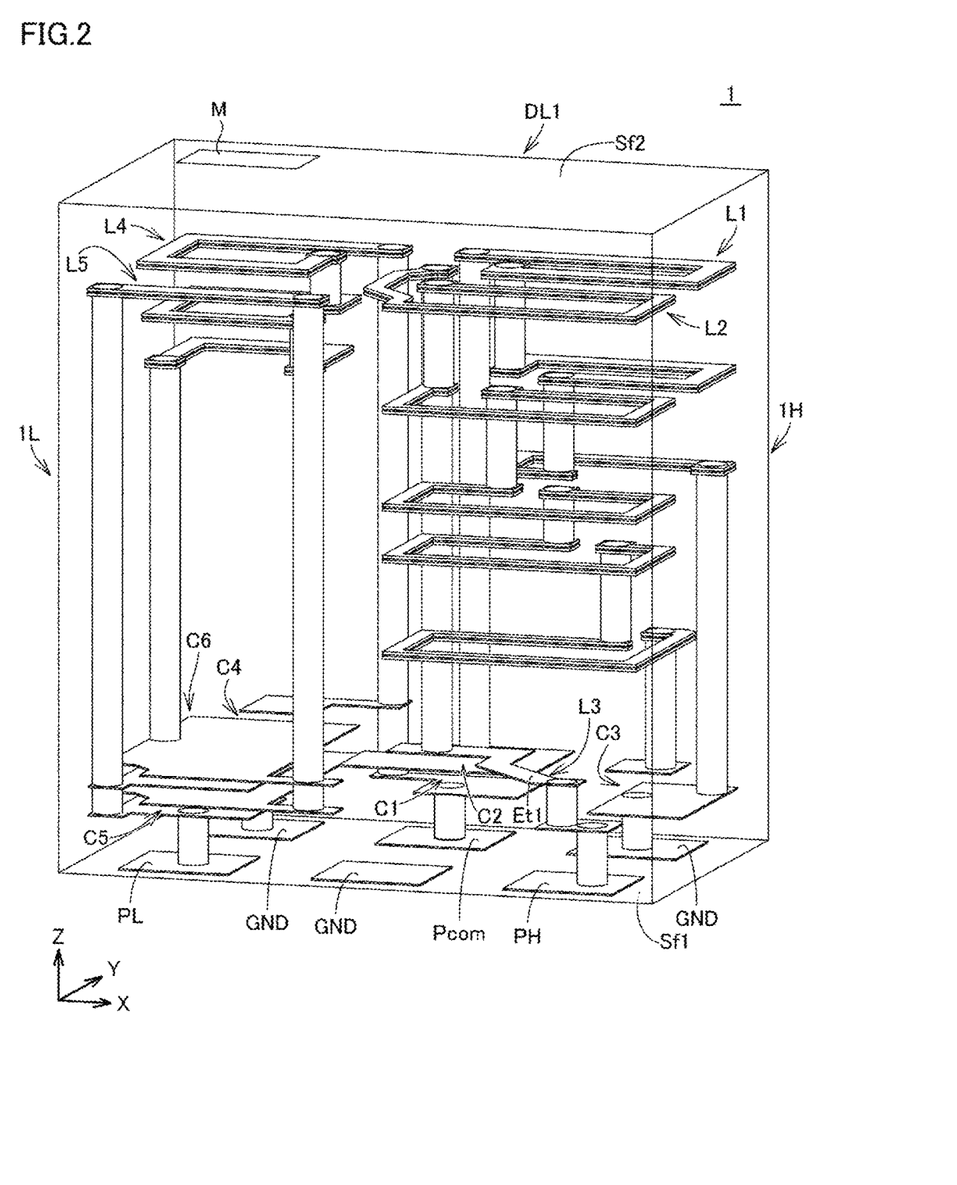
FIG. 2 is a perspective view illustrating an inside of a filter device according to an example embodiment of the present invention in a seeing-through manner.
Figure 3:
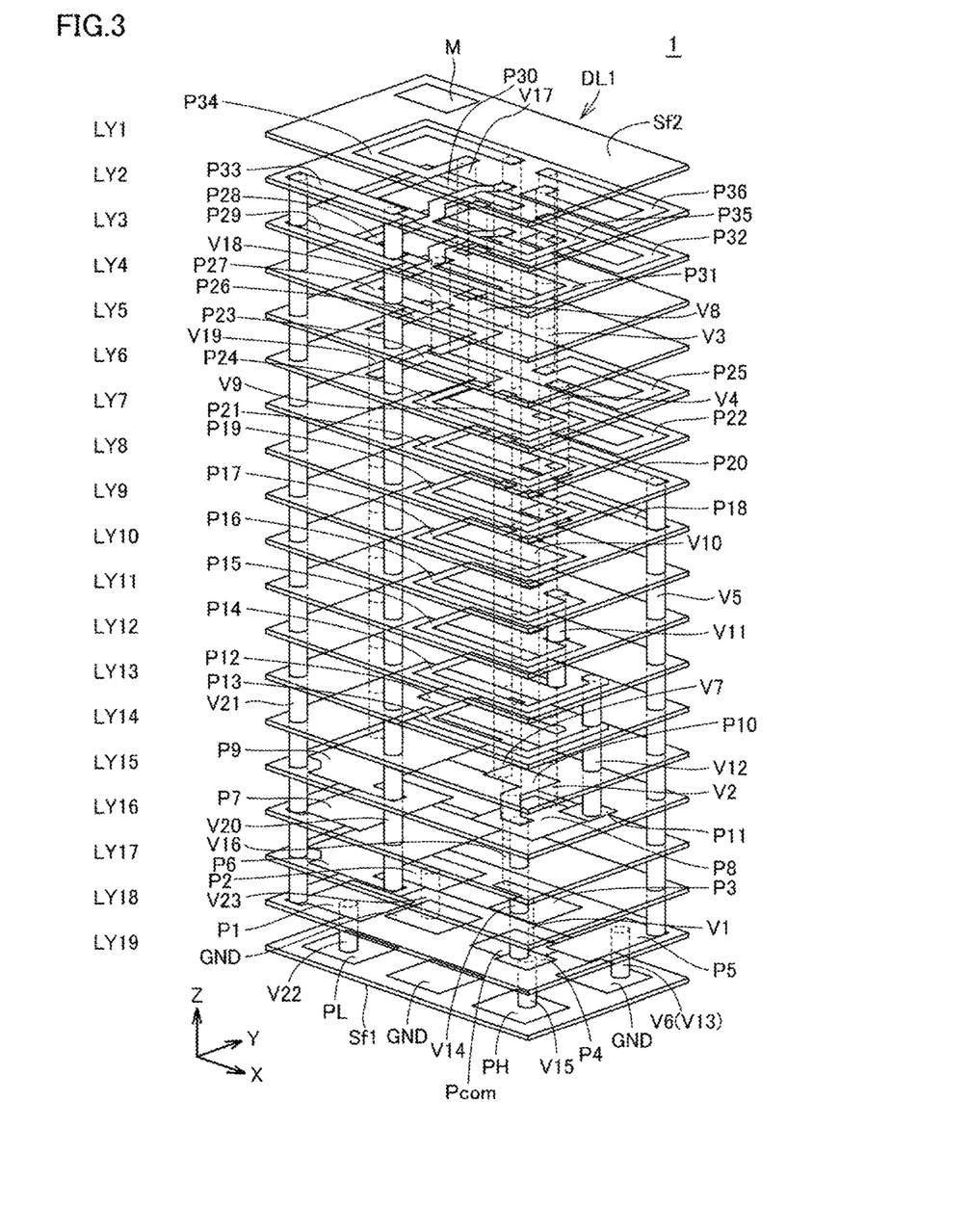
FIG. 3 is an exploded perspective view illustrating an example of a multilayer structure of a filter device according to an example embodiment of the present invention.

A structure of the filter device 1 will be described below with reference to FIGS. 2 to 4. FIG. 2 is a perspective view illustrating the inside of the filter device 1 in a seeing-through manner. FIG. 3 is an exploded perspective view illustrating an example of a multilayer structure of the filter device 1. As illustrated in FIGS. 2 and 3, the filter device 1 includes a dielectric substrate DL1. The dielectric substrate DL1 in this example embodiment is preferably provided by laminating multiple dielectric layers and has a rectangular or substantially rectangular parallelepiped shape.

In FIGS. 2 and 3, a lamination direction of the dielectric substrate DL1 is referred to as a "Z-axis direction". A direction that is perpendicular to the Z-axis direction and that extends along a long-side direction of an upper surface Sf2 in a plan view of the dielectric substrate DL1 is referred to as an "X-axis direction". A direction that is perpendicular to the Z-axis direction and that extends along a short-side direction of the upper surface Sf2 in the plan view of the dielectric substrate DL1 is referred to as a "Y-axis direction". In addition, a positive direction of a Z-axis in each drawing is referred to as an "upper side", a negative direction of the Z-axis is referred to as a "lower side", and the Z-axis direction is referred to as a "normal direction of the dielectric substrate DL1" in some cases.

The dielectric layers included in the dielectric substrate DL1 are made of ceramic, such as LTCC (Low Temperature Co-fired Ceramics), or resin. According to a certain aspect of an example embodiment of the present disclosure, the dielectric substrate DL1 may be made of a single dielectric layer instead of the multiple dielectric layers.

The dielectric substrate DL1 includes a lower surface Sf1 and the upper surface Sf2. The common terminal Pcom, the first terminal PH, the second terminal PL, and the ground terminals GND, described above with reference to FIG. 1, each have a flat shape. The common terminal Pcom, the first terminal PH, the second terminal PL, and the ground terminals GND are each an LGA (Land Grid Array) terminal at the lower surface Sf1.

FIGS. 2 and 3 illustrate an example in which the multiple ground terminals GND (three in an example described in this example embodiment) are provided. The lower surface Sf1 of the filter device 1 is connected to a circuit board (not illustrated) by using a connector such as a solder bump. A direction mark M usable to specify a direction of the filter device 1 is provided at the upper surface Sf2.

Multiple electrodes and vias of the equivalent circuit illustrated in FIG. 1 are provided inside the dielectric substrate DL1. The common terminal Pcom is connected to a flat electrode P3 through a via V1. In this Description, the term "via" indicates a conductor that is provided on or in the dielectric layer to connect the electrodes located at or in the different dielectric layers. The via is made of, for example, a conductive paste, a plating, and/or a metal pin.

As described above in connection with FIG. 1, the filter 1H includes the capacitor C1, the capacitor C2, the capacitor C3, the inductor L1, the inductor L2, and the inductor L3. As illustrated in FIG. 2, those components included in the filter 1H are included in the dielectric substrate DL1 and defined by the electrodes and the vias on the relatively positive direction side of an X-axis.

Furthermore, as described above in connection with FIG. 1, the filter 1L includes the capacitor C4, the inductor L4, the capacitor C5, the capacitor C6, and the inductor L5. As illustrated in FIG. 2, those components included in the filter 1L are included in the dielectric substrate DL1 and defined by the electrodes and the vias on the relatively negative direction side of the X-axis.

As illustrated in FIG. 3, the dielectric substrate DL1 in this example embodiment is preferably provided by laminating the multiple dielectric layers (dielectric layers LY1 to LY19) in the lamination direction. The following description is made about mutual connection relationships of the electrodes in the dielectric layers and the vias between the dielectric layers by referring to FIG. 3.

The electrodes provided on or ins will be described below with reference to FIG. 3. In FIG. 3, for easier understanding of arrangement of individual flat electrodes, the flat electrodes are all drawn with solid lines. The common terminal Pcom, the first terminal PH, the second terminal PL, and the ground terminals GND are located at the lower surface Sf1 of the dielectric substrate DL1 (in the dielectric layer LY19). The flat electrodes P1 to P5 are provided on or in the dielectric layer LY18. The flat electrode P6 is provided on or in the dielectric layer LY17. The flat electrodes P7 and P8 are provided on or in the dielectric layer LY16. The flat electrodes P9 to P11 are provided on or in the dielectric layer LY15.

The flat electrode P12 is provided on or in the dielectric layer LY14. The flat electrode P13 is provided on or in the dielectric layer LY13. The flat electrode P14 is provided on or in the dielectric layer LY12. The flat electrode P15 is provided on or in the dielectric layer LY11. The flat electrode P16 is provided on or in the dielectric layer LY10.

The flat electrodes P17 and P18 are provided on or in the dielectric layer LY9. The flat electrodes P19 and P20 are provided on or in the dielectric layer LY8. The flat electrodes P21 to P23 are provided on or in the dielectric layer LY7. The flat electrodes P24 to P26 are provided on or in the dielectric layer LY6.

The flat electrode P27 is provided on or in the dielectric layer LY5. The flat electrode P28 is provided on or in the dielectric layer LY4. The flat electrodes P29 to P32 are provided on or in the dielectric layer LY3. The flat electrodes P33 to P36 are provided on or in the dielectric layer LY2.

The connection relationships between the individual terminals and the individual flat electrodes P1 to P36 are now described. The common terminal Pcom is connected to the flat electrode P3 on or in the dielectric layer LY18 by the via V1. The flat electrode P3 on or in the dielectric layer LY18 faces the flat electrode P8 on or in the dielectric layer LY16. The capacitor C1 in FIG. 1 is defined by the flat electrode P3 and the flat electrode P8. The flat electrode P3 and the flat electrode P8 correspond respectively to a "first flat electrode" and a "second flat electrode" in the present disclosure.

The flat electrode P8 is connected to the flat electrode P36 on or in the dielectric layer LY2 and the flat electrode P32 on or in the dielectric layer LY3 by the via V2. The flat electrode P36 and the flat electrode P32 are connected to the flat electrode P25 provided on or in LY6 by the via V3. In the filter device 1 according to this example embodiment, the two flat electrodes P32 and P36 are located between the via V2 and the via V3 to reduce loss. According to a certain aspect, only one of the two flat electrodes P32 and P36 may be included in the filter device 1.

The flat electrode P25 is connected to the flat electrode P22 provided on or in LY7 and the flat electrode P20 provided on or in LY8 by the via V4. The flat electrode P20 is connected to the flat electrode P18 provided on or in LY9 and the flat electrode P5 provided on or in LY18 by the via V5. The flat electrode P5 is connected to the ground terminal GND provided on or in LY19 by the via V6.

The inductor L1 in FIG. 1 is defined by the flat electrodes P18, P20, P22, P25, P32, and P36. The flat electrodes P18, P20, P22, P25, P32, and P36 of the inductor L1 are each a strip-shaped flat electrode and are arranged to encircle around the same winding axis extending in the Z-axis direction. The flat electrode P18 and the flat electrode P20 have a similar shape. The flat electrode P22 and the flat electrode P25 have a similar shape. The flat electrode P32 and the flat electrode P36 have a similar shape. In other words, the flat electrodes P18, P20, P22, P25, P32, and P36 define a helical coil.

The flat electrode P8 provided on or in LY16 faces the flat electrode P10 provided on or in LY15. The capacitor C2 in FIG. 1 is defined by the flat electrode P8 and the flat electrode P10. The flat electrode P8 and the flat electrode P10 correspond respectively to the "second flat electrode" and a "third flat electrode" in the present disclosure.

The flat electrode P10 is connected to the flat electrode P31 provided on or in LY3 and the flat electrode P35 provided on or in LY2 by the via V7. The flat electrode P31 and the flat electrode P35 are connected to the flat electrode P24 provided on or in LY6 by the via V8.

In the filter device 1 according to this example embodiment, the two flat electrodes P31 and P35 are located between the via V7 and the via V8 to reduce loss. According to a certain aspect, only one of the two flat electrodes P31 and P35 may be included in the filter device 1.

The flat electrode P24 is connected to the flat electrode P21 provided on or in LY7 and the flat electrode P19 provided on or in LY8 by the via V9. The flat electrode P19 is connected to the flat electrode P17 provided on or in LY9 and the flat electrode P16 provided on or in LY10 by the via V10. The flat electrode P16 is connected to the flat electrode P15 provided on or in LY11 and the flat electrode P14 provided on or in LY12 by the via V11. The flat electrode P14 is connected to the flat electrode P13 provided on or in LY13 and the flat electrode P11 provided on or in LY15 by the via V12.

The flat electrode P11 provided on or in LY15 faces the flat electrode P5 provided on or in LY18. The capacitor C3 in FIG. 1 is defined by the flat electrode P11 and the flat electrode P5. The flat electrode P5 is connected to the ground terminal GND provided on or in LY19 by the via V13. The via V13 is the same as the via V6.

The inductor L2 in FIG. 1 is defined by the flat electrodes P13 to P17, P19, P21, P24, P31, and P35. The flat electrodes P13 to P17, P19, P21, P24, P31, and P35 of the inductor L1 are each a strip-shaped flat electrode and are arranged to encircle around the same winding axis extending in the Z-axis direction. The flat electrode P13 and the flat electrode P14 have a similar shape. The flat electrode P15 and the flat electrode P16 have a similar shape. The flat electrode P17 and the flat electrode P19 have a similar shape. The flat electrode P21 and the flat electrode P24 have a similar shape. The flat electrode P31 and the flat electrode P35 have a similar shape. In other words, the flat electrodes P13 to P17, P19, P21, P24, P31, and P35 define a helical coil.

The flat electrode P10 is connected to the flat electrode P4 provided on or in LY18 by the via V14. The flat electrode P4 is connected to the first terminal PH provided on or in LY19 by the via V15.

As illustrated in FIG. 1, the filter device 1 includes the inductor L3. The flat electrode P10 illustrated in FIGS. 2 and 3 extends up to a position of the via V14 to be electrically connected to the via V14. As illustrated in FIG. 2, a portion of the flat electrode P10, the portion not overlapping with the flat electrode P8, is referred to as a lead-out portion Et1. The lead-out portion Et1 of the flat electrode P10 defines and functions as the inductor L3. With such a configuration, the function of a low-pass filter is added to the filter 1H, and the pass band of the filter 1H on the higher frequency side is expanded.

The flat electrode P3 is connected to the flat electrode P30 provided on or in LY3 and the flat electrode P34 provided on or in LY2 by the via V16. The flat electrode P30 and the flat electrode P34 are connected to the flat electrode P28 provided on or in LY4 by the via V17. In the filter device 1 according to this example embodiment, the two flat electrodes P30 and P34 are located between the via V16 and the via V17 to reduce loss. According to a certain aspect, only one of the two flat electrodes P30 and P34 may be included in the filter device 1.

The flat electrode P28 is connected to the flat electrode P27 provided on or in LY5 and the flat electrode P26 provided on or in LY6 by the via V18. The flat electrode P26 is connected to the flat electrode P23 provided on or in LY6 and the flat electrode P9 provided on or in LY15 by the via V19.

The inductor L4 in FIG. 1 is defined by the flat electrodes P23, P26 to P28, P30, and P34. The flat electrodes P23, P26 to P28, P30, and P34 of the inductor L4 are each a strip-shaped electrode and are arranged to encircle around the same winding axis extending in the Z-axis direction. The flat electrode P23 and the flat electrode P26 have a similar shape. The flat electrode P27 and the flat electrode P28 have a similar shape. The flat electrode P30 and the flat electrode P34 have a similar shape. In other words, the flat electrodes P23, P26 to P28, P30, and P34 define a helical coil.

The flat electrode P9 is connected to the flat electrode P33 provided on or in LY2 and the flat electrode P29 provided on or in LY3 by the via V20. The flat electrode P33 and the flat electrode P29 are connected to the flat electrode P1 provided on or in LY18 by the via V21. The via V20, the via V21, and the flat electrodes P28 and P33 define the inductor L5 in FIG. 1.

In the filter device 1 according to this example embodiment, the two flat electrodes P29 and P33 are located between the via V20 and the via V21 to reduce loss. According to a certain aspect, only one of the two flat electrodes P29 and P33 may be included in the filter device 1. The flat electrode P1 is connected to the second terminal PL provided on or in LY19 by the via V22.

The flat electrode P3 is connected to the flat electrode P12 provided on or in LY13 by the via V16. The flat electrode P12 provided on or in LY13 faces the flat electrode P9 provided on or in LY17. The capacitor C4 in FIG. 1 is defined by the flat electrode P12 and the flat electrode P9.

The flat electrode P9 is connected to the flat electrode P6 provided on or in LY17 by the via V20. The flat electrode P6 provided on or in LY17 faces the flat electrode P1 provided on or in LY18. The capacitor C5 in FIG. 1 is defined by the flat electrode P6 and the flat electrode P1.

The flat electrode P6 faces the flat electrode P2 provided on or in LY18. The capacitor C6 in FIG. 1 is defined by the flat electrode P6 and the flat electrode P2. The flat electrode P2 is connected to the ground terminal GND provided on or in LY19 by the via V23.

Figure 4:
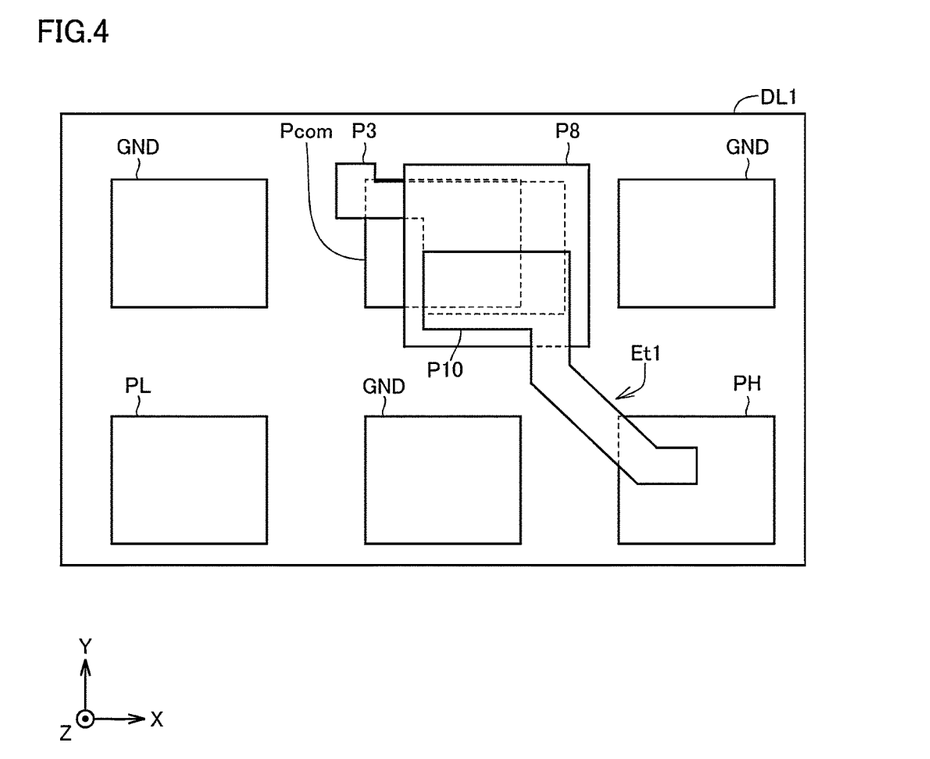
FIG. 4 is a plan view looking at some of components included in dielectric layers LY14 to LY19 from a normal direction of a dielectric substrate.

FIG. 4 is a plan view looking at some of the components included in the dielectric layers LY14 to LY19 from the normal direction of the dielectric substrate DL1. In the plan view of FIG. 4, the dielectric substrate DL1 is viewed from the positive direction side of the Z-axis.

FIG. 4 illustrates the common terminal Pcom, the first terminal PH, the second terminal PL, the ground terminals GND, the flat electrode P3 and the flat electrode P8 defining the capacitor C1, and the flat electrode P8 and the flat electrode P10 defining the capacitor C2.

As illustrated in FIG. 4, in the plan view looking from the normal direction of the dielectric substrate DL1, the flat electrode P3 and the flat electrode P10 overlap with each other at least partially. Furthermore, because the flat electrode P8 faces each of the flat electrode P3 and the flat electrode P10, the flat electrode P8 overlaps with each of the flat electrode P3 and the flat electrode P10 at least partially.

As described above, in the filter device 1 according to this example embodiment, the flat electrode P3 and the flat electrode P10 overlap with each other, and the flat electrode P8 overlaps with the flat electrode P3 and the flat electrode P10, and thus the capacitor C1 and the capacitor C2 are provided. Thus, in the filter device 1 according to this example embodiment, the flat electrode P8 does not need to extend in an XY-plane for electrical connection between the flat electrode P3 and the flat electrode P10. Stated another way, since the capacitor C1 and the capacitor C2 are close to each other, the flat electrode P3 does not need to have a portion to connect the capacitor C1 and the capacitor C2 separately in addition to portions to define the capacitor C1 and the capacitor C2.

In the filter device 1 according to this example embodiment, since a connection distance between the capacitor C1 and the capacitor C2 is short, a parasitic inductance is small. Thus, in the filter device 1 according to this example embodiment, the parasitic inductance generated in the connection portion between the capacitor C1 and the capacitor C2, both connected in series between the common terminal Pcom and the first terminal PH, can be reduced, and characteristics of the filter device 1 can be improved. While, in this example embodiment, the flat electrodes P3, P8, and P10 are arranged in the order of the flat electrodes P3, P8, and P10 from the negative direction side of the Z-axis, the arrangement order of the flat electrodes P3, P8, and P10 is not limited to the above-mentioned one. In another example, the flat electrodes P3, P8, and P10 may be arranged in the order of the flat electrodes P10, P8, and P3 from the negative direction side of the Z-axis.

Furthermore, as illustrated in FIG. 4, in the plan view looking from the normal direction of the dielectric substrate DL1, each of the flat electrode P3 and the flat electrode P8 of the capacitor C1 does not overlap with any of the ground terminals GND. Similarly, in the plan view looking from the normal direction of the dielectric substrate DL1, each of the flat electrode P8 and the flat electrode P10 of the capacitor C2 does not overlap with any of the ground terminals GND.

With the above-described arrangement, in the filter device 1 according to this example embodiment, the parasitic inductance can be reduced or prevented from being generated between each of the capacitor C1 and the capacitor C2 and the ground terminal GND, and the loss attributable to the parasitic inductance can be reduced.

Moreover, in the plan view looking from the normal direction of the dielectric substrate DL1, at least a portion of each of the flat electrode P3, the flat electrode P8, and the flat electrode P10 overlaps with the common terminal Pcom and is positioned right above the common terminal Pcom. In the filter device 1 according to this example embodiment, therefore, a route from the common terminal Pcom to the first terminal PH in FIG. 1 can be made shorter than that given in a structure in which the flat electrode P3 and the flat electrode P8 of the capacitor C1 and the flat electrode P8 and the flat electrode P10 of the capacitor C2 do not overlap with the common terminal Pcom. Accordingly, in the filter device 1 according to this example embodiment, the parasitic inductance can be reduced in the route from the common terminal Pcom to the first terminal PH.

In addition, in the plan view looking from the normal direction of the dielectric substrate DL1, a route electrically connecting between the capacitor C2 and the first terminal PH does not overlap with the ground terminal GND. The lead-out portion Et' of the flat electrode P10 defines and functions as the route electrically connecting between the capacitor C2 and the first terminal. As illustrated in FIG. 4, in the plan view looking from the normal direction of the dielectric substrate DL1, the lead-out portion Et' of the flat electrode P10 does not overlap with any of the ground terminals GND.

With the above-described arrangement, in the filter device 1 according to this example embodiment, the parasitic inductance can be reduced or prevented from being generated between the lead-out portion Et' of the flat electrode P10 and the ground terminal GND, and the loss attributable to the parasitic inductance can be reduced.

Figure 5:
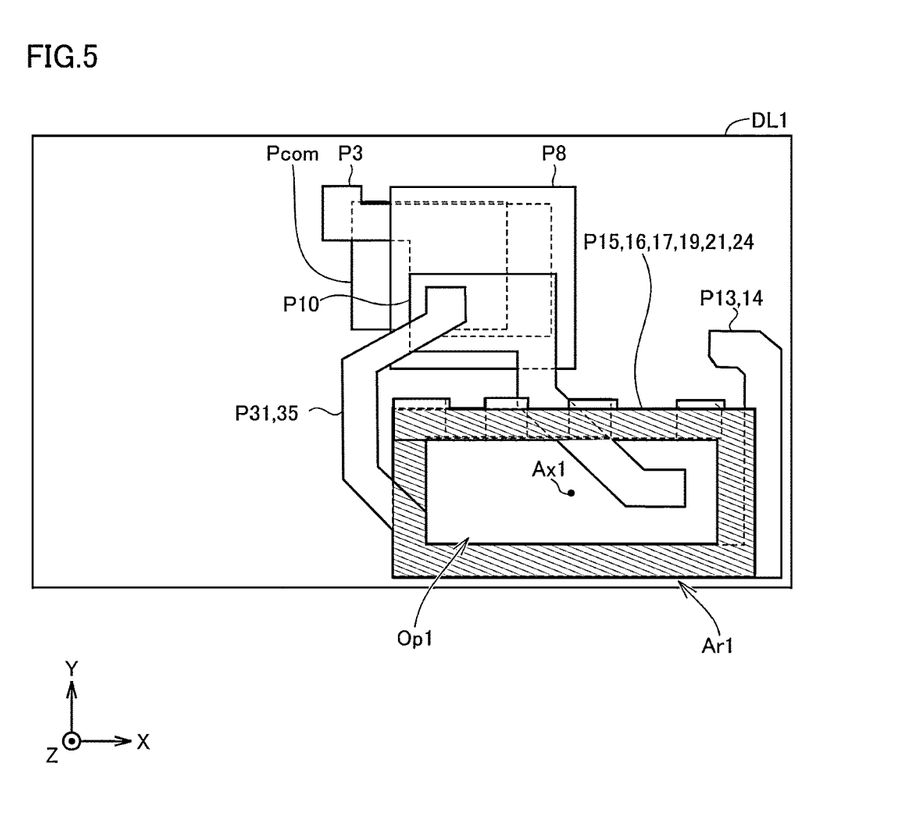
FIG. 5 is a plan view looking at only some of planar electrodes from a normal direction of a dielectric substrate.

An improvement in the characteristics of the filter device 1 is described here from the viewpoint of arrangement of the inductor L2. FIG. 5 is a plan view looking at only some of the planar electrodes from the normal direction of the dielectric substrate DL1. In FIG. 5, the various terminals illustrated in FIG. 4 are omitted, and the flat electrodes P13 to P17, P19, P21, P24, P31, and P35 of the inductor L2 are illustrated instead.

In this example embodiment, the inductor L2 is a helical coil with a winding axis Ax1 defined as the normal direction of the dielectric substrate DL1. The inductor L2 includes the flat electrodes P13 to P17, P19, P21, P24, P31, and P35. An opening Op1 of the inductor L2 is illustrated in FIG. 5 that is the plan view looking from the normal direction of the dielectric substrate DL1. In FIG. 5, a region Ar1 of the inductor L2 where the flat electrodes P13 to P17, P19, P21, P24, P31, and P35 overlap with one another is denoted by hatching. In other words, the flat electrodes P13 to P17, P19, P21, P24, P31, and P35 collectively indicated by the region Ar1 define the inductor L2.

As illustrated in FIG. 5, the flat electrodes P13 to P17, P19, P21, P24, P31, and P35 collectively indicated by the region Ar1 do not overlap with portions of respective regions of the flat electrodes P3, P8, and P10 where the capacitors C1 and C2 are provided. Comparing the filter device 1 according to this example embodiment with a configuration in which the capacitor C1 and the capacitor C2 do not overlap with each other in the plan view looking from the normal direction of the dielectric substrate DL1, an area occupied by the capacitors C1 and C2 in the XY-plane illustrated in FIG. 5 is smaller in the filter device 1 according to this example embodiment. Accordingly, when the inductor L2 is arranged not to overlap with the capacitors C1 and C2, the diameter of an air core of the inductor L2 cab be increased. Hence, in the filter device 1 according to this example embodiment, a Q-value of the filter device 1 can be increased. The inductor L2 corresponds to a "first inductor" in the present disclosure.

Furthermore, since the capacitors C1 and C2 do not overlap with the inductor L2 in the plan view looking from the normal direction of the dielectric substrate DL1, the characteristics of the filter device 1 can be suppressed or prevented from deteriorating in the filter device 1 according to this example embodiment, the deterioration being caused by the fact that, due to generation of electromagnetic field coupling between each of the capacitors C1 and C2 and the inductor L2, an impedance in a path from the node N2 to the ground terminal GND reduces and loss is caused.

Comparative Example

Figure 6:
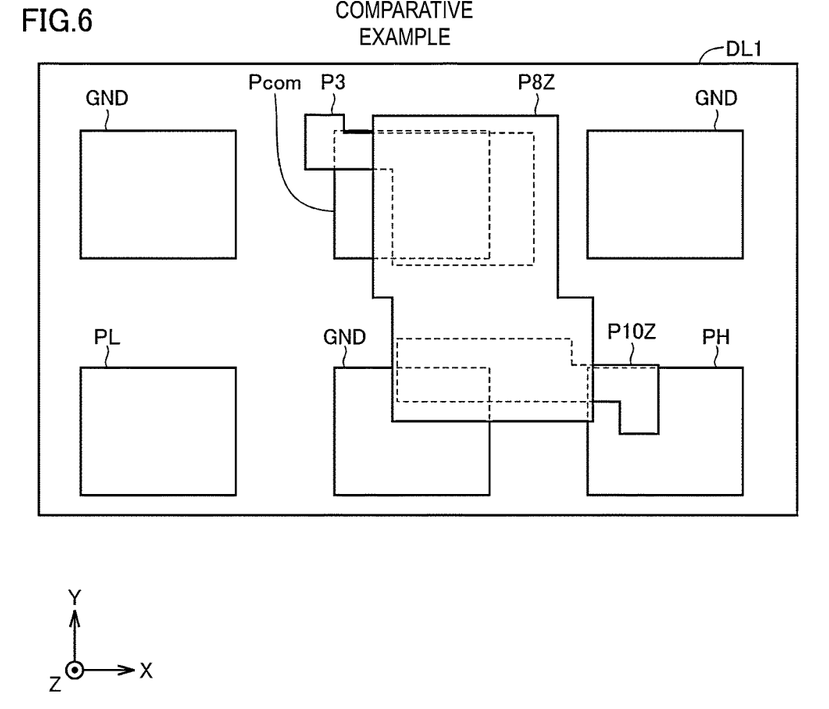
FIG. 6 is a plan view looking at some of components included in dielectric layers LY14 to LY19 from a normal direction of a dielectric substrate in COMPARATIVE EXAMPLE.

A filter device 1Z representing COMPARATIVE EXAMPLE for the filter device 1 according to this example embodiment will be described below with reference to FIG. 6. FIG. 6 is a plan view looking at some of components included in dielectric layers LY14 to LY19 from a normal direction of a dielectric substrate in COMPARATIVE EXAMPLE. In the plan view of FIG. 6, the dielectric substrate DL1 is viewed from the positive direction side of the Z-axis.

FIG. 6 illustrates the common terminal Pcom, the first terminal PH, the second terminal PL, the ground terminals GND, the flat electrode P3, a flat electrode P8Z, and a flat electrode P10Z. The flat electrode P3 and the flat electrode P8Z define a capacitor C1. The flat electrode P8Z and the flat electrode P10Z define a capacitor C2. In COMPARATIVE EXAMPLE, the flat electrode P3 and the flat electrode P10Z are located on the relatively negative direction side of the Z-axis relative to the flat electrode P8Z.

As illustrated in FIG. 6, in the plan view looking from the normal direction of the dielectric substrate DL1, the flat electrode P3 and the flat electrode P10Z do not overlap with each other. Therefore, the connection distance between the capacitor C1 and the capacitor C2 is longer than that in the configuration according to this example embodiment. Moreover, in COMPARATIVE EXAMPLE, the capacitor C2 is located at a position overlapping with the ground terminal GND in the plan view looking from the normal direction of the dielectric substrate DL1. In addition, although not illustrated, the capacitor C2 is located at a position overlapping with the inductor L2 in the plan view looking from the normal direction of the dielectric substrate DL1.

Characteristics of Filter Device 1

The characteristics of the filter device 1 according to this example embodiment will be described below. First, an improvement in the characteristics of the filter device 1 is described from the viewpoint of arrangement of the capacitor C1 and the capacitor C2.

Figure 7:
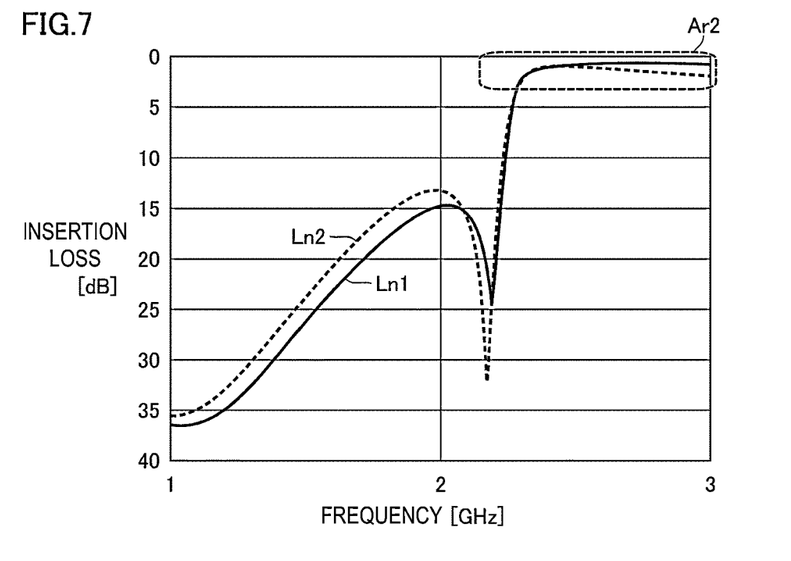
FIG. 7 is a graph depicting an example of respective insertion losses of a filter device according to an example embodiment of the present invention and a filter device according to COMPARATIVE EXAMPLE.

FIG. 7 is a graph depicting an example of insertion losses of respective filters 1H in the filter device 1 according to this example embodiment and the filter device 1Z according to COMPARATIVE EXAMPLE. A line Ln1 depicted in FIG. 7 indicates a waveform representing the insertion loss of the filter device 1 according to this example embodiment. A line Ln2 depicted in FIG. 7 indicates a waveform representing the insertion loss of the filter device 1Z according to COMPARATIVE EXAMPLE.

Figure 8:
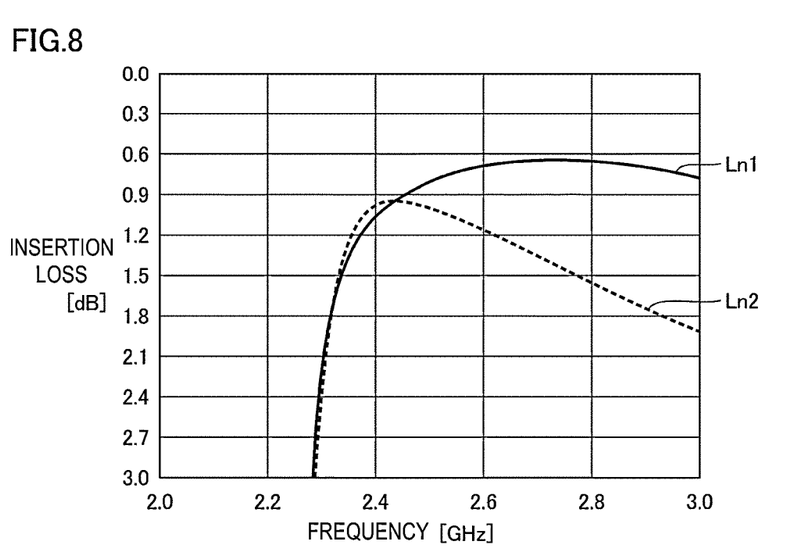
FIG. 8 is a graph depicting a region denoted in FIG. 7 with a vertical axis represented in an enlarged scale.

FIG. 8 is a graph depicting a region Ar2 denoted in FIG. 7 with a vertical axis represented in an enlarged scale. In FIG. 8, the waveforms in the region Ar2 depicted in FIG. 7 are represented in an enlarged scale in a direction of the vertical axis (insertion loss). For easier understanding of a difference between the lines Ln1 and Ln2, a scale of the horizontal axis (frequency) in FIG. 8 is the same as that in FIG. 7, and only the scale of the vertical axis (insertion loss) is enlarged.

As depicted in FIGS. 7 and 8, the insertion loss of the filter 1H in the filter device 1 according to this example embodiment is smaller than that of the filter 1H in the filter device 1Z according to COMPARATIVE EXAMPLE. More specifically, in a range from the vicinity of a frequency of about 2.42 GHz to a frequency of about 3.0 GHz, the insertion loss of the filter device 1 according to this example embodiment is smaller than that of the filter device 1Z according to COMPARATIVE EXAMPLE. In particular, at the frequency of about 3.0 GHz, the insertion loss of the filter 1H in the filter device 1 according to this example embodiment is about 1.2 dB smaller than that of the filter 1H in the filter device 1Z according to COMPARATIVE EXAMPLE.

As described above, in the filter device 1 according to this example embodiment, the flat electrode P3 and the flat electrode P10 overlap with each other in the plan view looking from the normal direction of the dielectric substrate DL1. With such a configuration, the connection distance between the capacitor C1 and the capacitor C2 becomes shorter. It is hence possible to reduce the parasitic inductance generated in the connection portion between the capacitor C1 and the capacitor C2 that are connected in series between the common terminal Pcom and the first terminal PH, and to improve the characteristics of the filter device 1.

While example embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A filter device comprising:
    a dielectric substrate;
    a common terminal, a first terminal, a second terminal, and a ground terminal in or on the dielectric substrate;
    a first filter connected between the common terminal and the first terminal; and
    a second filter connected between the common terminal and the second terminal and having a lower pass band than the first filter; wherein
    the first filter includes a first capacitor and a second capacitor connected in series between the common terminal and the first terminal;
    the first capacitor includes a first flat electrode and a second flat electrode facing each other;
    the second capacitor includes the second flat electrode and a third flat electrode facing each other;
    in a plan view looking from a normal direction of the dielectric substrate, the first flat electrode and the third flat electrode overlap with each other at least partially; and
    in the plan view looking from the normal direction of the dielectric substrate, at least one of a region where the first flat electrode overlaps with the second flat electrode and a region where the second flat electrode overlaps with the third flat electrode does not overlap with a ground electrode disposed within the dielectric substrate and connected to the ground terminal.

2. The filter device according to claim 1, wherein, in the plan view looking from the normal direction of the dielectric substrate, at least a portion of each of the first flat electrode, the second flat electrode, and the third flat electrode overlaps with the common terminal.

3. The filter device according to claim 1, wherein
    in the plan view looking from the normal direction of the dielectric substrate, each of the first flat electrode and the second flat electrode does not overlap with the ground terminal.

4. The filter device according to claim 3, wherein
    the first filter further includes a first inductor; and
    in the plan view looking from the normal direction of the dielectric substrate, the first inductor does not overlap with the first capacitor and the second capacitor.

5. The filter device according to claim 3, wherein the first filter further includes a second inductor connected between the second capacitor and the first terminal.

6. The filter device according to claim 5, wherein, in the plan view looking from the normal direction of the dielectric substrate, the second inductor does not overlap with the ground terminal.

7. The filter device according to claim 1, wherein
    in the plan view looking from the normal direction of the dielectric substrate, each of the second flat electrode and the third flat electrode does not overlap with the ground terminal.

8. The filter device according to claim 1, wherein
    in the plan view looking from the normal direction of the dielectric substrate, a route electrically connected between the second capacitor and the first terminal does not overlap with the ground terminal.

9. The filter device according to claim 1, wherein the filter device is a diplexer.

10. The filter device according to claim 1, wherein the filter device is a multiplexer.

11. The filter device according to claim 1, further comprising a plurality of ground terminals.

12. The filter device according to claim 1, wherein the dielectric substrate includes a plurality of dielectric layers.

13. The filter device according to claim 1, wherein two of the first, second and third flat electrodes are located between vias.

14. The filter device according to claim 1, wherein the third flat electrode does not include a portion connecting the first capacitor and the second capacitor.

15. The filter device according to claim 1, further comprising at least one inductor defined by a helical coil including a plurality of flat electrodes.

16. The filter device according to claim 15, wherein the first and second capacitors do not overlap the at least one inductor in the plan view looking from the normal direction of the dielectric substrate.

17. A dual-band communication device comprising the filter device according to claim 1.

18. The dual-band communication device according to claim 17, wherein the filter device is a diplexer.

19. The dual-band communication device according to claim 17, wherein the filter device is a multiplexer.

20. The dual-band communication device according to claim 17, wherein two of the first, second and third flat electrodes are located between vias.

* * * * *